United States Patent
Fujita et al.

(10) Patent No.: US 8,110,118 B2
(45) Date of Patent: Feb. 7, 2012

(54) METHOD OF MANUFACTURING CIRCUIT BOARD

(75) Inventors: Hiroyuki Fujita, Kawasaki (JP);
Yasutaka Ochiai, Kawasaki (JP);
Minoru Kubota, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 893 days.

(21) Appl. No.: 11/874,286

(22) Filed: Oct. 18, 2007

(65) Prior Publication Data
US 2008/0128384 A1    Jun. 5, 2008

(30) Foreign Application Priority Data
Oct. 18, 2006  (JP) ................. P2006-284152

(51) Int. Cl.
*H01B 13/00* (2006.01)
(52) U.S. Cl. .......... 216/20; 216/37; 216/67; 361/735; 361/794; 257/438; 257/698; 257/77; 257/729
(58) Field of Classification Search ............ 216/20, 216/37, 67; 361/735, 794; 257/438, 698, 257/77, 729
See application file for complete search history.

(56) References Cited

U.S. PATENT DOCUMENTS

| | | | |
|---|---|---|---|
| 6,687,984 B1 * | 2/2004 | Toyoshima et al. | 29/830 |
| 7,255,919 B2 * | 8/2007 | Sakata et al. | 428/352 |
| 7,532,485 B2 * | 5/2009 | Kimura et al. | 361/794 |
| 2004/0145044 A1 * | 7/2004 | Sugaya et al. | 257/698 |

FOREIGN PATENT DOCUMENTS

| | | |
|---|---|---|
| JP | 1-144696 A | 6/1989 |
| JP | 02199894 A | 8/1990 |
| JP | 04042592 A | 2/1992 |
| JP | 05-218642 A | 8/1993 |
| JP | 07106765 A | 4/1995 |
| JP | 11-126973 A | 5/1999 |
| JP | 2004-087624 A | 3/2004 |

OTHER PUBLICATIONS

Japanese Office Action for JP 2006-284152;, Jul. 5, 2011.

* cited by examiner

*Primary Examiner* — Lan Vinh
*Assistant Examiner* — Maki A Angadi
(74) *Attorney, Agent, or Firm* — Sughrue Mion, PLLC

(57) ABSTRACT

An adhesive layer, an insulating layer and a copper foil are laminated together on both surfaces of a metallic base material by way of for example thermal press molding. In this case, openings (window holes) are formed in opposed positions on a portion of the adhesive layer. A circuit pattern is formed by etching on the copper foil in this state, followed by an external shape machining step of executing separation treatment reaching the metallic base material in predetermined positions including the openings. After that, a part of the insulating layer is cut off along the edge of the opening to obtain a circuit board with the end of the metallic base material exposed.

10 Claims, 6 Drawing Sheets

METHOD OF MANUFACTURING CIRCUIT BOARD

BACKGROUND

The present invention relates to a method of manufacturing a circuit board capable of enhancing the heat dissipation effect by using a metallic base material as a base.

For example, a circuit board that mounts an electronic device evolving heat such as a semiconductor chip including a power FET uses a metallic base material in order to enhance the heat dissipation effect. The metallic base material includes copper or an aluminum raw material as a base. With a circuit board using a related art metallic base material as a base, a layer conductor (copper foil) is bonded to a metallic base material via a resin insulating layer and the unnecessary portion of the copper foil is dissolved and removed through etching to form a circuit pattern, the so-called subtractive method, is often used.

In this case, it is necessary to protect the metallic base material from a chemical liquid such as an etching liquid which is used to form a circuit pattern. This requires a step of covering the entire front and rear surfaces of the metallic base material with the resin insulating layer and a step of forming a protective resin insulating layer at the edges of the metallic base material.

Circuit boards are generally designed to enhance the heat dissipation effect by exposing a portion of the circuit board, preferably an end of the metallic base material formed in a rectangular shape and screwing the exposed portion onto a mounting part with a large thermal capacity such as a metallic mounting part. This requires a treatment step of exposing a portion of a metallic base material of a circuit board by shaving off a portion of the resin insulating layer after etching treatment.

As mentioned above, in case a surface cutting step of shaving off a portion of a resin insulating layer is employed after a step of forming a circuit pattern including the etching treatment, the corresponding treatment efficiency is extremely poor thus contributing to reduced mass productivity. Another problem is that chips of a resin insulating layer are deposited on a circuit pattern thus contaminating the same. Countermeasures against this problem are required.

As a method of manufacturing a circuit board without the need for protecting a metallic base material from a chemical liquid used for etching treatment has been proposed in JP-A-5-218642. According to the method of manufacturing a circuit board described in JP-A-5-218642, a first conductive layer is formed on a metallic base material via a first insulating layer and a second insulating layer with a second conductive layer formed thereon obtained in a separate step is stuck on the first conductive layer.

According to the description in JP-A-5-218642, a circuit pattern is formed on the second conductive layer through etching treatment on a copper foil in a separate step, so that there arises no special protection of the metallic base material as a base of the circuit board against the chemical liquid for etching treatment.

In the description in JP-A-5-218642, a method of sticking a copper foil punched into a pattern is used to form a first conductive layer on a metallic base material via a first insulating layer although a method may be used of forming a circuit pattern through etching treatment with a copper foil stuck on the entire surface. There is no description on practical measures of protecting a metallic base material during etching treatment in this example.

SUMMARY

An object of the invention is, as described above, to provide a method of manufacturing a circuit board with excellent mass productivity capable of forming a circuit pattern on a circuit board using a metallic base material as a base by way of etching treatment and effectively protecting the metallic base material from a chemical liquid used in the etching treatment without executing surface cutting especially in obtaining a circuit board having a portion of its metallic base material exposed.

In order to solve the problems, the invention provides a first method of manufacturing a circuit board comprising: a laminating step of laminating adhesive layers having an opening formed in a portion of at least one of the adhesive layers respectively on both surfaces of the metallic base material, laminating insulating layers on the adhesive layers respectively, and laminating a layer conductor on at least one of the insulating layers; a circuit pattern forming step of forming a circuit pattern by dissolving and removing a portion of the layer conductor with etching process; an external shape machining step of performing external shape machining of a circuit board by cutting the metallic base material in a predetermined position corresponding to the opening formed in the adhesive layer; and an insulating layer cutting step of cutting off a portion of the insulating layer covering the opening formed in the adhesive layer to expose the surface of the metallic base material corresponding to the position of the opening.

In this case, the opening is preferably formed in each of the adhesive layers laminated respectively on the front and rear surfaces of the metallic base material in the corresponding positions of the front and rear surfaces of the metallic base material and a portion of the insulating layer covering each opening formed in the adhesive layer is cut off in the insulating layer cutting step in order to expose the surface of the metallic base material.

In a preferable example, a portion of the insulating layer covering the opening formed in the adhesive layer is cut off along the edge of the opening.

In order to solve the problems, the invention provides a second method of manufacturing a circuit board comprising: a laminating step of laminating adhesive layers having an opening formed in a portion of at least one of the adhesive layers respectively on both surfaces of the metallic base material, laminating insulating layers on the adhesive layers respectively, and laminating a layer conductor on at least one of the insulating layers; a circuit pattern forming step of forming a circuit pattern by dissolving and removing a portion of the layer conductor with etching process; a cutout part forming step of forming a cutout part on an insulating layer for cutting off a portion of the insulating layer covering the opening formed in the adhesive layer; and an external shape machining step of performing external shape machining of a circuit board by cutting the metallic base material in a predetermined position corresponding to the opening formed in the adhesive layer; wherein the cutout part of the insulating layer formed in the cutout part forming step is used to cut off a portion of the insulating layer to expose the surface of the metallic base material.

In order to solve the problems, the invention provides a third method of manufacturing a circuit board comprising: a laminating step of forming a mold release mask on a portion of at least one surface of the metallic base material and laminating an insulating layer on each surface of the metallic base material including the portion where the mold release mask is formed; a circuit pattern forming step of forming a circuit pattern by dissolving and removing a portion of the layer conductor with etching process; an external shape machining step of performing external shape machining of a circuit board by cutting the metallic base material in a predetermined position corresponding to the mold release mask formed on the adhesive layer; and an insulating layer cutting step of exposing the surface of the metallic base material by cutting off a portion of the insulating layer covering the mold release mask formed on the metallic base material and peeling off the mold release mask from the surface of the metallic base material.

In this case, the mold release mask is preferably formed in the corresponding positions of the front and rear surfaces of the metallic base material and a portion of the insulating layer covering the mold release mask is cut off and the mold release mask is peeled off from the metallic base material to expose the surface of the metallic base material in the insulating layer cutting step.

In a further preferable example, a portion of the insulating layer is cut off along the edge where the mold release mask is formed in the insulating layer cutting step.

In order to solve the problems, the invention provides a fourth method of manufacturing a circuit board comprising: a laminating step of forming a mold release mask on a portion of at least one surface of the metallic base material and laminating an insulating layer on each surface of the metallic base material including the portion where the mold release mask is formed; a circuit pattern forming step of forming a circuit pattern by dissolving and removing a portion of the layer conductor by way of etching; a cutout part forming step of forming a cutout part on an insulating layer for cutting off a portion of the insulating layer covering the mold release mask; and an external shape machining step of performing external shape machining of a circuit board by performing separation treatment reaching the metallic base material in a predetermined position corresponding to the mold release mask formed on the adhesive layer; wherein the cutout part of the insulating layer formed in the cutout part forming step is used to cut off a portion of the insulating layer and the mold release mask is peeled off from the metallic base material to expose the surface of the metallic base material.

Preferably, the layer conductor is laminated on the insulating layer on each of the front and rear surfaces of the metallic base material and circuit patterns are simultaneously formed on the front and rear surfaces of the metallic base material in the circuit pattern forming step.

According to the first through fourth manufacturing methods, insulating layers are laminated respectively on the front and rear surfaces of the metallic base material. This effectively eliminates the problem of possible corrosion of a metallic base material as a base of the circuit board caused by a chemical liquid in the etching treatment in the subsequent circuit pattern forming step.

With the first manufacturing method of the invention, it is possible to readily expose a portion of the metallic base material by executing cutting treatment of cutting off a portion of the insulating layer covering the opening formed in the adhesive layer. With the second manufacturing method of the invention, it is possible to readily expose a portion of the metallic base material by previously forming a cutout part on a portion of the insulating layer covering the opening formed in the adhesive layer and cutting off a portion of the insulating layer while using the cutout part after the external shape machining step for the circuit board.

With the third manufacturing method of the invention, it is possible to readily expose a portion of the metallic base material by executing a cutting step of cutting off a portion of the insulating layer covering the mold release mask formed on the metallic base material and peeling off the mold release mask from the metallic base material. Further, with the fourth manufacturing method of the invention, it is possible to readily expose a portion of the metallic base material by previously forming a cutout part on a portion of the insulating layer covering mold release mask formed on the metallic base material and cutting off a portion of the insulating layer while using the cutout part for the circuit board and peeling off the mold release mask from the metallic base material after the external shape machining step.

It is possible to effectively dissipate heat from the metallic base material portion in an exposed state by screwing the exposed portion onto a mounting part with larger thermal capacity. Use of the methods for manufacturing a circuit board can do without an ineffective surface cutting step of shaving off a portion of a resin insulating layer thus contributing to the productivity (mass productivity) of this type of circuit board including a metallic base material.

It is possible to remove the edge the metallic base material where a chemical liquid is attached in etching treatment by executing separation treatment reaching the metallic base material in a predetermined position corresponding to the opening formed in the adhesive layer in the first and second manufacturing methods and in a predetermined position corresponding to the position where a peel-off mask is formed in the third and fourth manufacturing methods. This provides a reliable circuit board without possible corrosion of a metallic base material as a core.

DETAILED DESCRIPTION OF EXEMPLARY EMBODIMENTS

Figure 1:
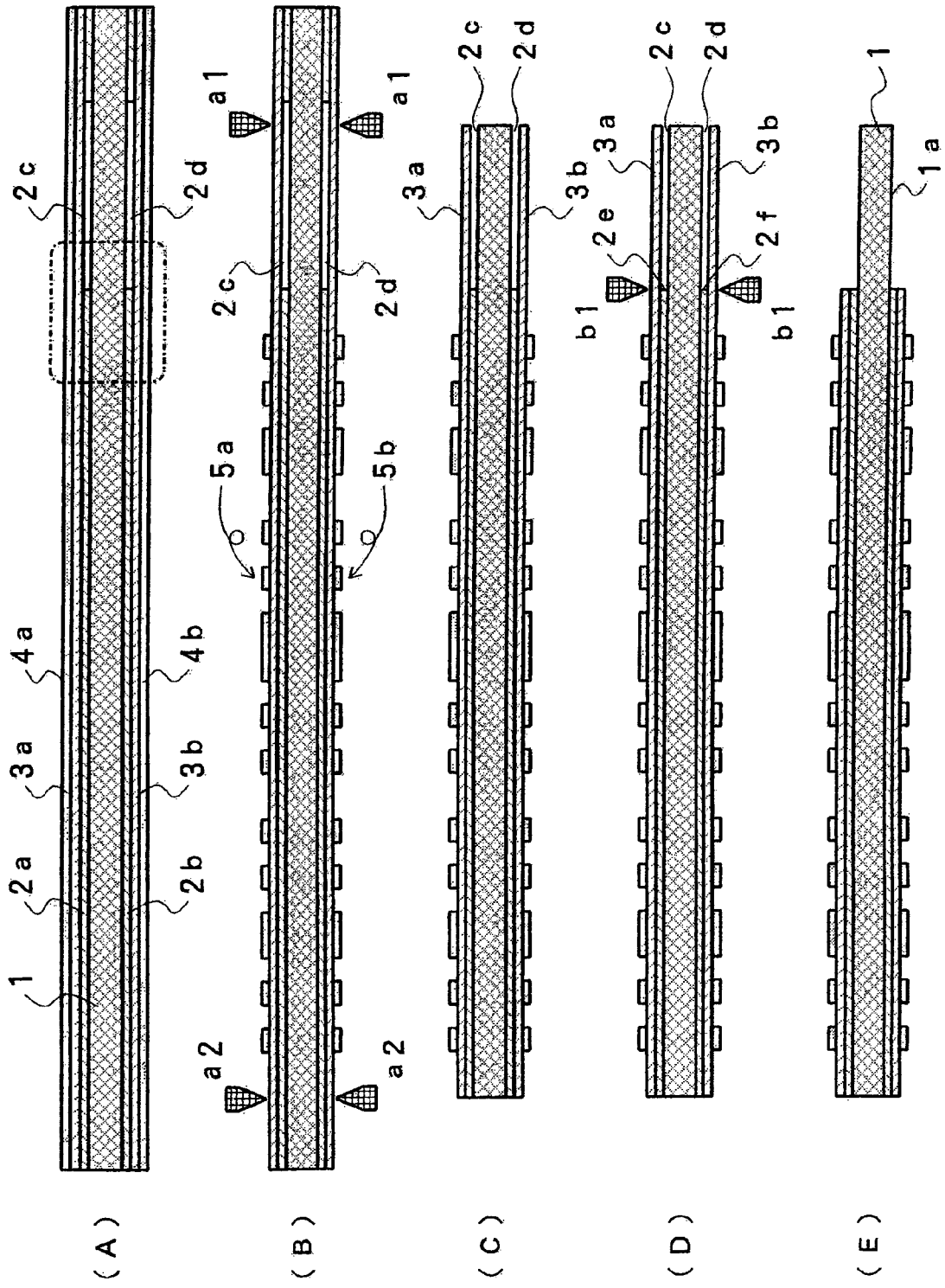
FIG. 1 shows cross sections of a board in accordance with the steps followed in the first manufacturing method of the invention.
Figure 2:
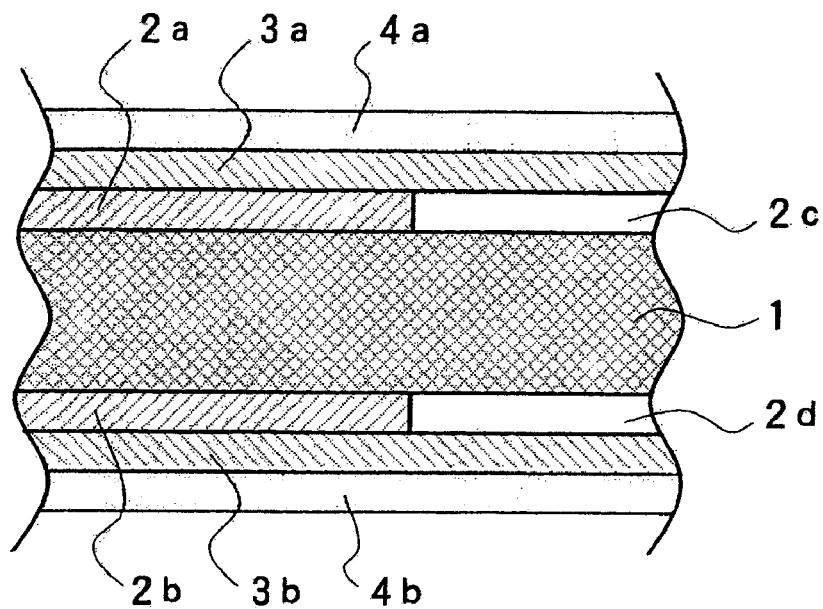
FIG. 2 is a partial enlarged cross-sectional view of a portion enclosed by chain lines shown in FIG. 1(A).
Figure 3:
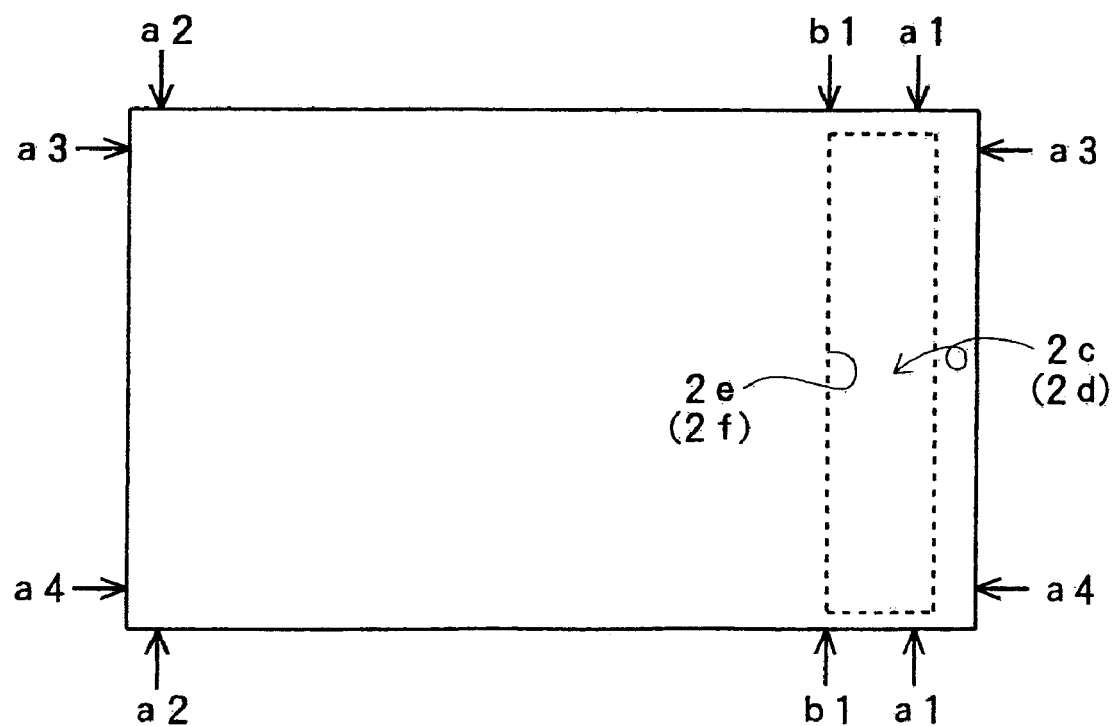
FIG. 3 is a plan view of the board from one surface.

The first through fourth circuit board manufacturing methods of the invention will be described in order. FIGS. 1 through 3 illustrate the first manufacturing method. FIG. 1 shows cross sections of the circuit board in accordance with the manufacturing steps. FIG. 2 is a partial enlarged cross-sectional view of a portion enclosed by chain lines shown in FIG. 1(A). FIG. 3 is a plan view of the board from one surface. FIGS. 1 through 3 respectively show examples of separating a portion of the board in the external shape machining step for the circuit board described later.

For the convenience of explanation, FIG. 3 shows a basic example of the external shape machining step for a circuit board assuming a case in which a single circuit board is obtained from a workpiece. In reality, the workpiece has a form with a large area corresponding to a plurality of circuit boards. Thus, a multi-patterning process is employed whereby circuit patterns are simultaneously formed and then the workpiece is separated into circuit boards.

FIG. 1(A) shows a state where the adhesive layers 2a, 2b, insulating layers 3a, 3b and layer conductors (copper foils) 4a, 4b are laminated in this order respectively on the front and rear surfaces of the metallic base material 1 by execution of the laminating step. The metallic base material 1 is made of a material having excellent thermal conductivity such as copper, iron or aluminum. In this example, the metallic base material 1 is formed into a uniform thickness and the external shape as a workpiece is rectangular as shown in FIG. 3.

The adhesive layers 2a, 2b laminated on the top and bottom surfaces of the metallic base material 1 may be formed of a resin sheet with an inorganic paint coated thereon. The adhesive layers 2a, 2b are formed into a rectangular shape having a surface area equivalent to that of the metallic base material 1 and are stuck to cover the whole area of the top and bottom surfaces of the metallic base material 1.

In this embodiment, the adhesive layers 2a, 2b have openings (window holes) 2c, 2d formed in a portion thereof. The openings 2c, 2d are respectively formed in a rectangular shape near the end of the adhesive layers 2a, 2b in longitudinal direction. That is, in this embodiment, the rectangular openings 2c, 2d are formed to overlay in the adhesive layers 2a, 2b laminated on both surfaces of the metallic base material 1 in the corresponding positions in a direction orthogonal to the surface of the metallic base material 1.

The insulating layers 3a, 3b laminated on the adhesive layers 2a, 2b are made of an epoxy resin or glass fibers impregnated with an epoxy resin. The insulating layers 3a, 3b are also formed in a rectangular shape having a surface area equivalent to that of the metallic base material 1 and the adhesive layers 2a, 2b and are laminated on the adhesive layers 2a, 2b to cover the whole area of the top and bottom surfaces of the metallic base material 1, together with the adhesive layers 2a, 2b.

Copper foils 4a, 4b serving as layer conductors is laminated on the insulating layers 3a, 3b so as to cover the entire surface of the insulating layers 3a, 3b. The adhesive layers 2a, 2b, the insulating layers 3a, 3b and the copper coils 4a, 4b may be laminated together by way of thermal press molding.

The board (workpiece) laminated together by the laminating process shown in FIG. 1(A) has the copper foils 4a, 4b simultaneously subjected to circuit pattern forming process including development, etching, pickling and surface treatment as shown in FIG. 1(B). As is well known, except the necessary portion of the copper foils 4a, 4b selectively are remained, the other portions of the copper foils are dissolved and removed by etching to form circuit patterns 5a, 5b on the front and rear surfaces of the board.

The board with the circuit patterns 5a, 5b formed on both surfaces thereof is subjected to the external shape machining shown in FIG. 1(B) and FIG. 3. This is the separation treatment reaching the metallic base material 1 in predetermined positions including the positions of the rectangular openings 2c, 2d formed in a portion of the adhesive layers 2a, 2b. The portions of the workpiece that is subjected to the separation treatment are shown by references a1 and a2 opposed to each other in FIG. 1(B).

At the same time, similar separation treatment reaching the metallic base material 1 is executed in respective positions of the references a3 and a4 opposed to each other. With this treatment, the four sides of the metallic base material 1 where the chemical liquid used in the circuit pattern forming process is deposited are cut off thus leaving the central portion of the metallic base material 1 not influenced by the chemical liquid.

As described earlier, the workpiece formed having an area corresponding to several circuit boards undergoes the separation treatment reaching the metallic base material 1 in a predetermined position to obtain separate circuit boards each of which has undergone external shape machining. The separation process made in the opposed positions of a1, a2, a3, a4 shown in FIG. 3 in the external shape machining process corresponds to a process of cutting off the end of each of the four sides of a large-area workpiece. Adjacent boards each need not include a margin of the four sides to be cut off. This is true to the second to fourth manufacturing methods described later.

As shown in FIG. 1(C), with the execution of the separation process in the external shape machining process, the ends of the insulating layers 3a, 3b corresponding to the positions where the openings 2c, 2d are formed are left while separated from the metallic base material 1 at one end (right end shown in FIG. 1) of the board.

FIG. 1(D) shows how the insulating layer cutting process of cutting off a part of the insulating layer left in a portion where the openings 2c, 2d are formed along the edge of the openings. As shown by the references b1 opposed to each other in FIG. 1(D) and FIG. 3, the treatment of cutting off the insulating layers 3a, 3b is executed by using a cutter along the edges 2e, 2f of the openings formed in the adhesive layers 2a, 2b.

As shown in FIG. 1(E), through execution of the insulating layer cutting process, it is possible to expose a portion (end) of the metallic base material 1. By mounting, with a screw, one surface 1a of the exposed metallic base material 1 onto a mounting part with a large thermal capacity such as a metallic mounting part, it is possible to effectively dissipate heat through the mounting part.

Figure 4:
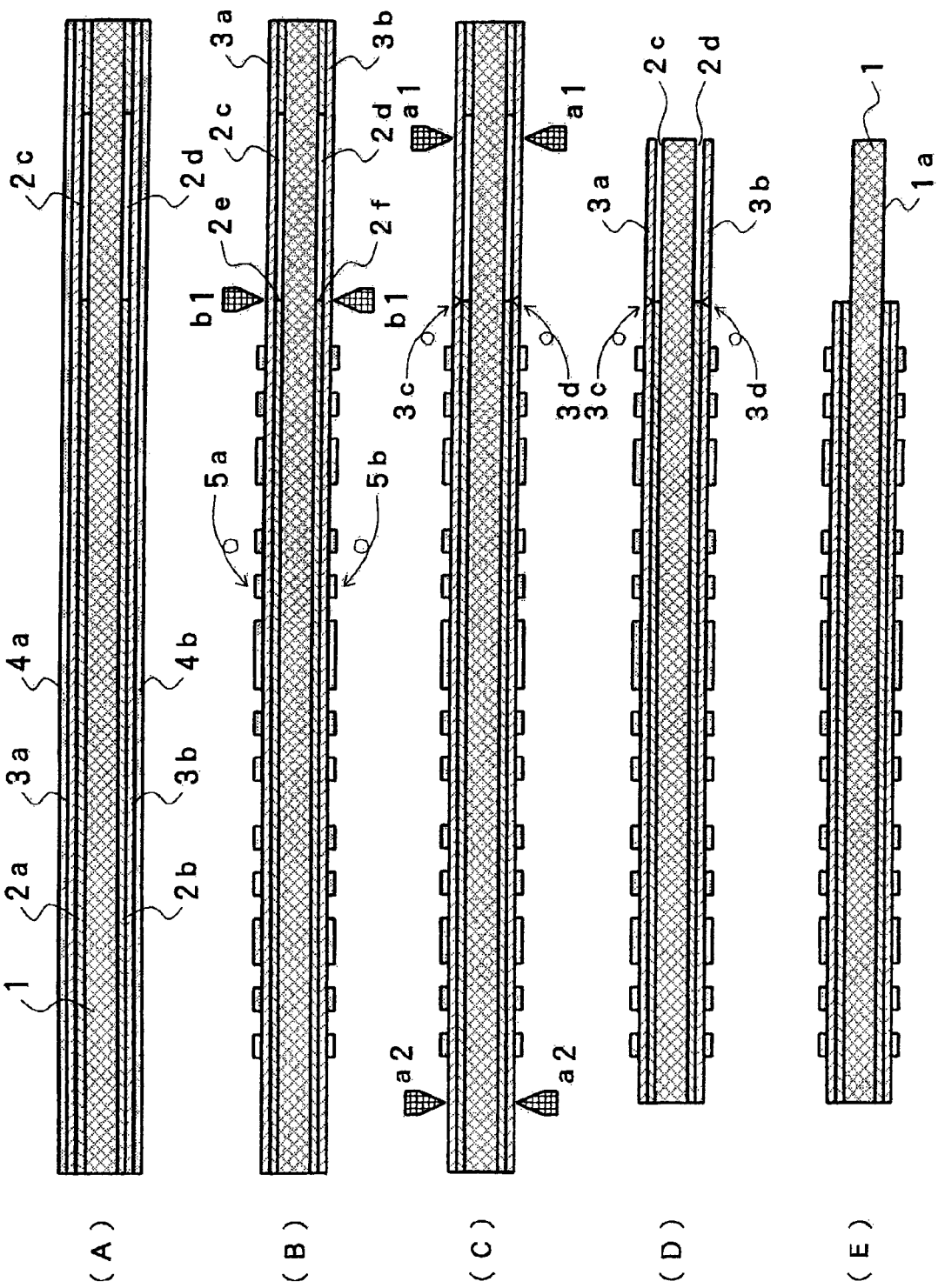
FIG. 4 shows cross sections of a board in accordance with the steps followed in the second manufacturing method of the invention.

FIG. 4 illustrates the second circuit board manufacturing method of the invention. Same as FIG. 1 explained earlier, FIG. 4 shows cross sections of a board in the order of manufacturing processes. In FIG. 4, parts corresponding to the parts in FIG. 1 explained earlier are represented by the same references and corresponding detailed description is omitted as required.

In the second manufacturing method, a process of forming a cutout part on a portion of the insulating layer in a portion covering the opening formed in the adhesive layer takes place before the external shape machining of executing the external shape machining of a circuit board. At the same time as the external shape machining process or after the external shape machining process, a portion of the insulating layer is cut off by using the cutout part of the insulating layer. This exposes the surface of the metallic base material in a position corresponding to the opening in the adhesive layer.

FIG. 4(A) shows the same laminating process as that in FIG. 1(A) explained earlier. In this embodiment, as shown in FIG. 4(B), a circuit pattern forming process is executed to form circuit patterns 5a, 5b on the front and rear surfaces of a board, followed by a process of forming a cutout part on the insulating layers 3a, 3b as shown by the references b1 opposed to each other.

As shown in FIG. 4(B), operation to form a cutout part on the insulating layers 3a, 3b by using a cutter shown by the reference b1 along the edges 2e, 2f of the openings formed in the adhesive layers 2a, 2b in the cutout part forming process according to this embodiment. The cutout parts formed in this process are shown by references 3c, 3d in FIG. 4(C).

As shown by the references a1 and a2 opposed to each other in FIG. 4(C), an external shape machining process reaching the metallic base material 1 is executed on the workpiece. In the external shape machining process, as explained referring to FIG. 3, separation treatment reaching the metallic base material 1 is executed also in respective positions of the references a3 and a4 opposed to each other. With this treatment, the four sides of the metallic base material 1 where the chemical liquid used in the circuit pattern forming process is deposited are cut off thus leaving the central portion of the metallic base material 1 not influenced by the chemical liquid.

As shown in FIG. 4(D), it is possible to obtain a circuit board in the state shown in FIG. 4(E) where the surface of the metallic base material is exposed, by using the cutout parts 3c, 3d on the insulating layers formed in the cutout part forming process to cut off a portion of the insulating layers 3a, 3b. The depth of the cutout parts 3c, 3d on the insulating layers should be great enough to allow concurrent execution of the cutting treatment of the insulating layers 3a, 3b corresponding to the positions of the openings 2c, 2d in the execution of the external shape machining process shown in FIG. 4(C).

Also with the second manufacturing method described above, it is possible to obtain a circuit board having the same configuration as that obtained through the first manufacturing method.

Figure 5:
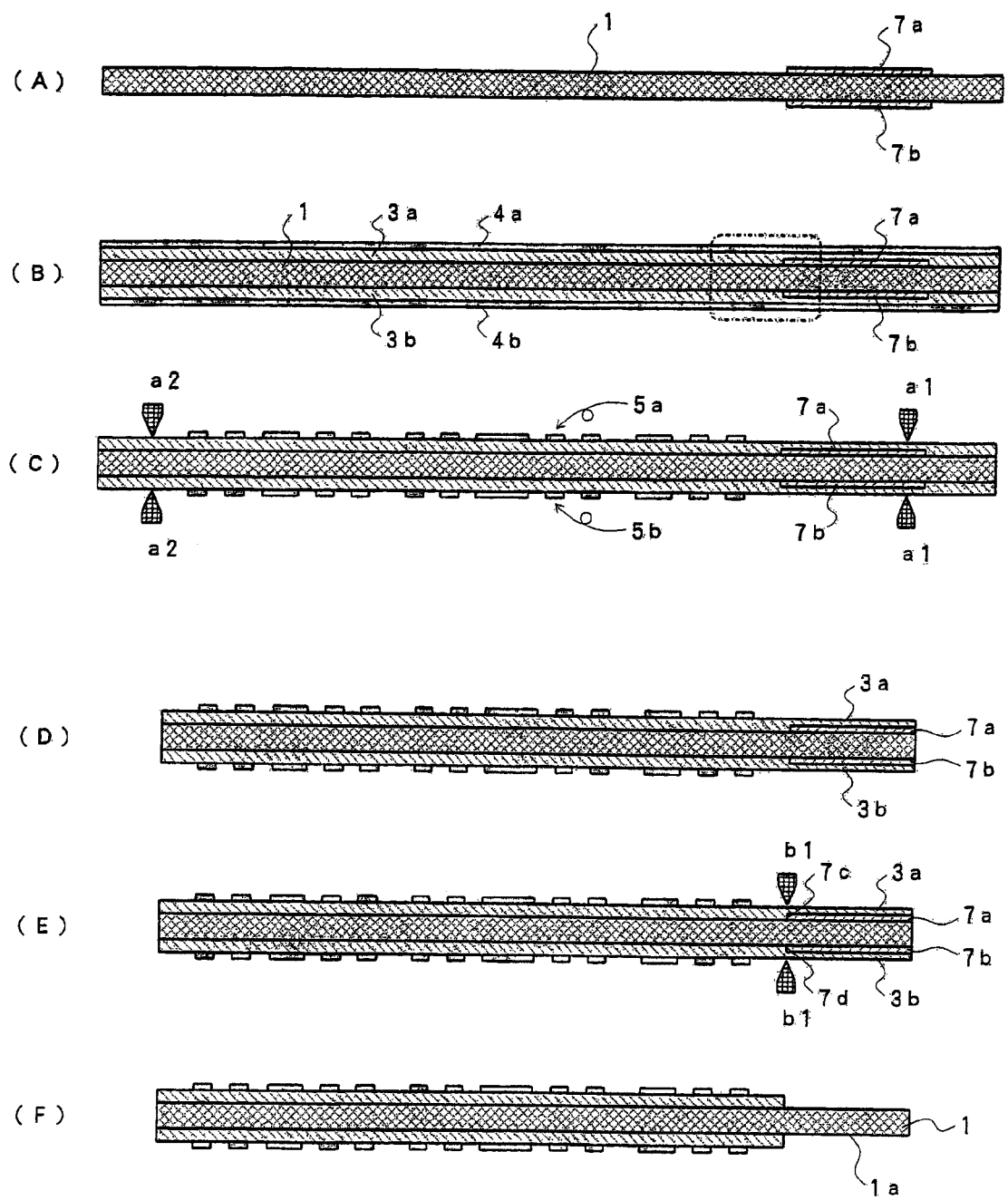
FIG. 5 shows cross sections of a board in accordance with the steps followed in the third manufacturing method of the invention.

FIG. 5 illustrates the third circuit board manufacturing method of the invention. Same as FIG. 1 explained earlier, FIG. 5 shows cross sections of a board in the order of manufacturing processes. In FIG. 5, parts corresponding to the parts in FIG. 1 explained earlier are represented by the same references and corresponding detailed description is omitted as required.

In the third manufacturing method, a mold release mask is formed on a portion of at least one surface of the metallic base material. This obtains the same feature as that of the opening in the adhesive layer provided by the first manufacturing method described above.

FIG. 5(A) shows an example where mold release masks 7a, 7b are formed on the surface of the metallic base material 1 to be finally exposed. The example shown in FIG. 5(A) has mold release masks 7a, 7b formed in the corresponding positions of the front and rear surfaces of the metallic base material 1. Formation of the mold release masks 7a, 7b may use a tape-shaped mold release agent formed by a heat-resistant material or a pasty mold release agent. The mold release masks formed by the tape-shaped mold release agent or the pasty mold release agent may be readily peeled off from the surface of the metallic base material in the subsequent processes. This provides a circuit board having a portion of the metallic base material exposed.

Figure 6:
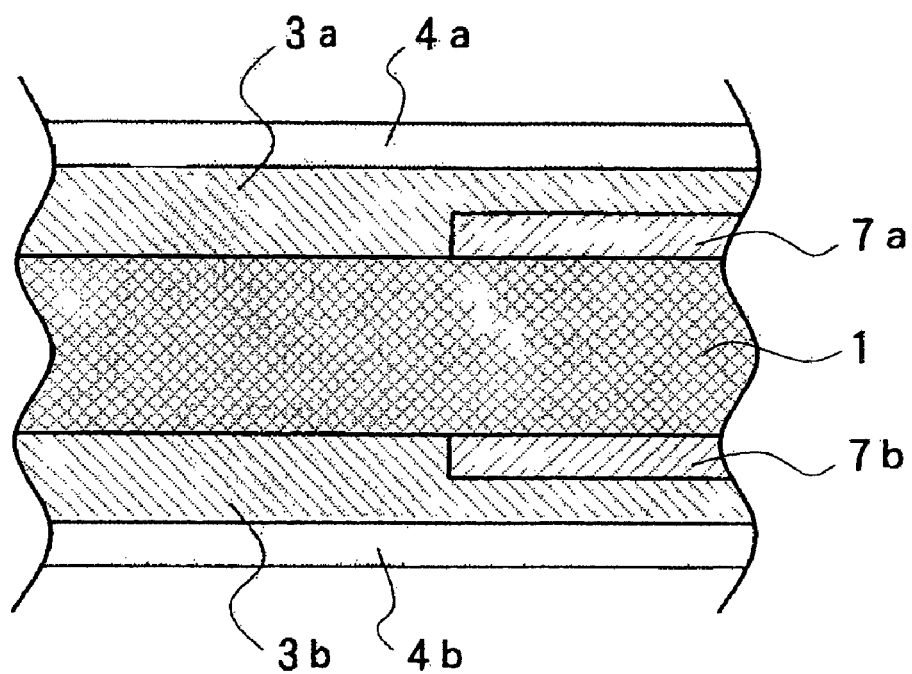
FIG. 6 is a partial enlarged cross-sectional view of a portion enclosed by chain lines shown in FIG. 5.

As shown in FIG. 5(A), in the state where the mold release masks 7a, 7b are formed on a portion of the metallic base material 1, insulating layers 3a, 3b and layer conductors (copper foils) 4a, 4b are laminated in this order on both surfaces of the metallic base material 1 including the mold release masks 7a, 7b as shown in FIG. 5(B). In this embodiment, a fluid prepreg (molding intermediate material obtained by impregnating carbon fibers with a resin) may be preferably used as the insulating layers 3a, 3b although the invention is not limited thereto. FIG. 6 is a partial enlarged cross-sectional view of a portion enclosed by chain lines shown in FIG. 5(B).

The board (workpiece) laminated together through the laminating process shown in FIG. 5(B) undergoes the circuit pattern forming process of simultaneously forming circuit patterns 5a, 5b on the copper foils 4a, 4b as shown in FIG. 5(C). Then, external shape machining of a board is executed including the separation treatment reaching the metallic base material 1 in predetermined positions including the positions where the mold release masks 7a, 7b are formed.

The separation positions formed in this process are shown by the references a1 and a2 shown in FIG. 5(C) opposed to each other. At the same time, separation treatment is executed in a direction orthogonal to the direction of separation by a1 and a2. This treatment is executed in the same fashion as the example including a3 and a4 shown in FIG. 3 described earlier. With this treatment, the four sides of the metallic base material 1 where the chemical liquid used in the circuit pattern forming process is deposited are cut off thus leaving the central portion of the metallic base material 1 not influenced by the chemical liquid.

With the execution of separation treatment in the external shape machining process, as shown in FIG. 5(D), the formation positions of the mold release masks 7a, 7b are left at one end of the board (right end in the figure). FIG. 5(E) shows execution of an insulating layer cutting process of cutting off a portion of the insulating layers 3a, 3b formed on the mold release masks 7a, 7b along the edge of the formation positions of the mold release masks 7a, 7b. That is, as shown by the opposed references b1, treatment to cut off the insulating layers 3a, 3b by using a cutter along the edges of the formation positions of the mold release masks 7a, 7b is executed.

This leaves the mold release masks 7a, 7b on both surfaces of the end of the metallic base material 1. The mold release masks may be readily peeled off from the metallic base material 1 as described earlier. As shown in FIG. 5(F), it is possible to obtain a single circuit board with the surface of the metallic base material 1 at one end exposed.

Figure 7:
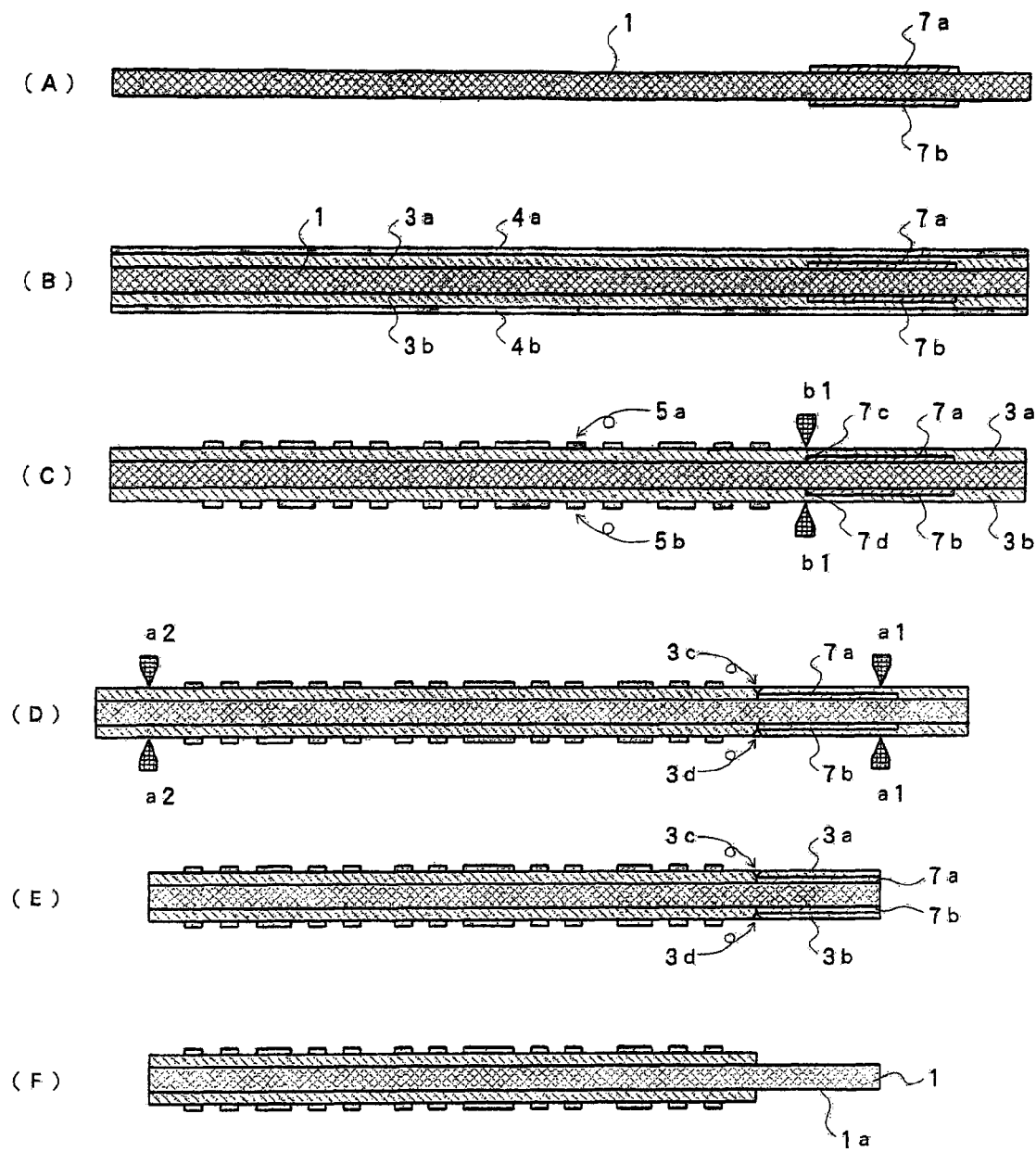
FIG. 7 shows cross sections of a board in accordance with the steps followed in the fourth manufacturing method of the invention.

FIG. 7 illustrates the fourth circuit board manufacturing method of the invention. Same as FIG. 5 explained earlier, FIG. 7 shows cross sections of a board in the order of manufacturing processes. In FIG. 7, parts corresponding to the parts in FIG. 5 explained earlier are represented by the same references and corresponding detailed description is omitted as required.

The fourth manufacturing method, same as the third manufacturing method, forms a mold release mask on a metallic base material. The fourth manufacturing method, same as the second manufacturing method, executes a process of forming a cutout part on a portion of an insulating layer in the portion covering the mold release mask before the external shape machining process of executing external shape machining of a circuit board.

FIG. 7(A) shows an example where mold release masks 7a, 7b are formed on the surface of the metallic base material 1 to be finally exposed, same as FIG. 5(A) explained earlier. FIG. 7(B) shows a laminating process similar to that shown in FIG. 5(B). In this embodiment, as shown in FIG. 7(C), a process of forming a cutout part on the insulating layers 3a, 3b is executed as shown by the opposed references b1 after a circuit pattern forming process of forming circuit patterns 5a, 5b on the front and rear surfaces of a board.

As shown in the figure, operation to form a cutout part on the insulating layers 3a, 3b by using a cutter shown by the reference b1 along the edges 7c, 7d of the mold release masks 7a, 7b in the cutout part forming process according to this embodiment. The cutout parts formed in this process are shown by references 3c, 3d in FIG. 7(D).

As shown by the references a1 and a2 opposed to each other in FIG. 7(D), an external shape machining process reaching the metallic base material 1 is executed on the workpiece. In the external shape machining process, separation treatment is executed at the same time in a direction orthogonal to the direction of separation by the references a1 and a2. This is done in a similar way to the example including a3, a4 shown in FIG. 3. With this treatment, the four sides of the workpiece where the chemical liquid used in the circuit pattern forming process is deposited are cut off thus leaving the central portion of the metallic base material 1 not influenced by the chemical liquid.

As shown in FIG. 7(E), it is possible to readily cut off a portion of the insulating layers on the mold release masks 7a, 7b, by using the cutout parts 3c 3d on the insulating layers. The depth of the cutout parts 3c, 3d on the insulating layers should be great enough to allow concurrent execution of removal of a portion of the insulating layers 3a, 3b on the mold release masks 7a, 7b at the execution of the external shape machining process shown in FIG. 7(D).

This leaves the mold release masks 7a, 7b on both surfaces of the end of the metallic base material 1. The mold release masks may be readily peeled off from the metallic base material 1 as described earlier. As shown in FIG. 7(F), it is possible to obtain a single circuit board with the surface of the metallic base material at one end exposed.

Solder resist may be laid as required on the circuit patterns 5a, 5b of the board obtained by the first through fourth manufacturing methods described above. An electronic device may be mounted as required on the circuit patterns 5a, 5b by using for example wire bonding.

While the layer conductors (copper foils) 4a, 4b are laminated on the front and rear surfaces of a board and the circuit patterns 5a, 5b are formed on the front and rear surfaces of the layer conductor in the foregoing embodiments, a circuit pattern may be formed on one surface alone. In such a case also, the working effects of the invention is obtained.

While the openings 2c, 2d are formed on both adhesive layers 2a, 2b and both surfaces of a metallic base material is exposed in the embodiments related to the first and second manufacturing methods, only one surface of the metallic base material may be exposed by forming the opening in any one of the adhesive layers.

Similarly, while the mold release masks 7a, 7b are formed on both surfaces of a metallic base material and both surfaces of the metallic base material is exposed in the embodiments related to the third and fourth manufacturing methods, only one surface of the metallic base material may be exposed by forming the mold release mask on any one surface of the metallic base material. In such a case also, it is possible to cause a metallic base material to come into contact with a mounting part by using the one surface of the exposed metallic base material thereby obtaining the similar working effects.

What is claimed is:

1. A method of manufacturing a circuit board comprising:
   a laminating step of laminating adhesive layers on both surfaces of a metallic base material respectively, laminating insulating layers on the adhesive layers respectively, and laminating a layer conductor on at least one of the insulating layers, wherein an opening is formed in a portion of at least one of the adhesive layers;
   a circuit pattern forming step of forming a circuit pattern by dissolving and removing a portion of the layer conductor with an etching process;
   an external shape machining step of performing external shape machining of the circuit board by cutting the metallic base material in a predetermined position corresponding to the opening formed in the adhesive layer; and
   an insulating layer cutting step of cutting off a portion of the insulating layer which covers the opening formed in the adhesive layer to expose the surface of the metallic base material corresponding to the position of the opening.

2. The method of manufacturing a circuit board according to claim 1, wherein the opening is formed in each of the adhesive layers in the corresponding positions of the front and rear surfaces of the metallic base material, the adhesive layers being laminated on the front and rear surfaces of the metallic base material respectively; and
   wherein in the insulating layer cutting process, portions of the insulating layers which cover the openings formed in the each of adhesive layers are cut off to expose the surfaces of the metallic base material.

3. The method of manufacturing a circuit board according to claim 1, wherein the portion of the insulating layer which covers the opening formed in the adhesive layer is cut off along an edge of the opening.

4. The method of manufacturing a circuit board according to claim 1, further comprising a cutout part forming step of forming a cutout part on the insulating layer for cutting off the portion of the insulating layer which covers the opening formed in the adhesive layer,
   wherein the cutout part of the insulating layer formed in the cutout part forming process is used to cut off the portion of the insulating layer which covers the opening formed in the adhesive layer to expose the surface of the metallic base material in the insulating layer cutting process.

5. The method of manufacturing a circuit board according to claim 1, wherein the layer conductor is laminated on the insulating layer on each of front and rear surfaces of the metallic base material; and
   wherein circuit patterns are simultaneously formed on the front and rear surfaces of the metallic base material respectively in the circuit pattern forming process.

6. A method of manufacturing a circuit board comprising:
   a laminating step of forming a mold release mask on a portion of at least one of both surfaces of the metallic base material, laminating insulating layers on the both surfaces of the metallic base material including the portion where the mold release mask is formed, and laminating a layer conductor on at least one of the insulating layers;
   a circuit pattern forming step of forming a circuit pattern by dissolving and removing a portion of the layer conductor with an etching process;
   an external shape machining step of performing external shape machining of a circuit board by cutting off the metallic base material in a predetermined position corresponding to the mold release mask formed on the metallic base material; and
   an insulating layer cutting step of cutting off a portion of the insulating layer which covers the mold release mask formed on the metallic base material and remove the mold release mask from the surface of the metallic base material to expose the surface of the metallic base material.

7. The method of manufacturing a circuit board according to claim 6, wherein the mold release mask is formed in the corresponding positions of front and rear surfaces of the metallic base material; and
   wherein in the insulating layer cutting process, portions of the insulating layers which cover the mold release masks are cut off and the mold release masks are removed from the metallic base material to expose the surfaces of the metallic base material.

8. The method of manufacturing a circuit board according to claim 6, wherein the portion of the insulating layer is cut off along an edge of the mold release mask in the insulating layer cutting step.

9. The method of manufacturing a circuit board according to claim 6, further comprising a cutout part forming step of forming a cutout part on the insulating layer for cutting off the portion of the insulating layer which covers the mold release mask, wherein the cutout part of the insulating layer formed in the cutout part forming process is used to cut off the portion of the insulating layer which covers the opening formed in the adhesive layer and the mold release mask is removed from the metallic base material to expose the surface of the metallic base material.

10. The method of manufacturing a circuit board according to claim 6, wherein the layer conductor is laminated on the insulating layer on each of front and rear surfaces of the metallic base material; and wherein circuit patterns are simultaneously formed on the front and rear surfaces of the metallic base material respectively in the circuit pattern forming process.

* * * * *